United States Patent [19]
Bhargava et al.

[11] Patent Number: 5,101,320
[45] Date of Patent: Mar. 31, 1992

[54] APPARATUS FOR RACK MOUNTING MULTIPLE CIRCUIT BOARDS

[75] Inventors: Vikram Bhargava, Alpharetta; Donald A. Muntner, Stone Mountain; Ronald H. Cone, Jefferson; James R. Heberling, Lawrenceville; Mark E. Hicks; Samuel W. Harris, both of Norcross, all of Ga.; David A. Kutilek, San Bruno; Joseph A. Duvivier, Oakland, both of Calif.

[73] Assignee: Hayes Microcomputer Products, Inc., Norcross, Ga.

[21] Appl. No.: 684,012

[22] Filed: Apr. 11, 1991

Related U.S. Application Data

[62] Division of Ser. No. 644,266, Jan. 22, 1991.

[51] Int. Cl.⁵ .............................................. H05K 7/20
[52] U.S. Cl. ..................................... 361/384; 211/41; 165/80.3; 361/415
[58] Field of Search ...................... 357/81; 174/16.1; 165/80.3, 104.33, 185, 908; 211/41; 361/381–384, 390–394, 415

[56] References Cited

U.S. PATENT DOCUMENTS

| | | | |
|---|---|---|---|
| 3,387,648 | 6/1968 | Ward, Jr. et al. | 361/384 |
| 3,962,608 | 6/1976 | Forster et al. | 361/384 |
| 4,466,049 | 8/1984 | Chaney | 361/383 |
| 4,536,824 | 8/1985 | Barrett | 361/384 |
| 4,600,968 | 7/1986 | Sekiya | 361/394 |
| 4,672,509 | 6/1987 | Speraw | 361/384 |
| 4,674,004 | 6/1987 | Smith | 361/384 |
| 4,716,498 | 12/1987 | Ellis | 361/386 |
| 4,716,499 | 12/1987 | Bhargava | 361/395 |
| 4,717,216 | 1/1988 | Hornak | 312/257 R |
| 4,860,163 | 8/1989 | Sarath | 361/384 |
| 4,867,235 | 9/1989 | Grapes | 165/185 |
| 4,923,179 | 5/1990 | Mikolajczak | 267/160 |

Primary Examiner—Gerald P. Tolin
Attorney, Agent, or Firm—Jones, Askew & Lunsford

[57] ABSTRACT

An improved rack assembly is provided which includes an improved configuration for mounting multiple enclosed circuit boards. The rack assembly includes improvements in heat sinking power supplies incorporated within the assembly, relative adjustability of various elements of the rack after assembly, and ventilation of the rack during operation in an efficient manner.

8 Claims, 13 Drawing Sheets

FIG. A

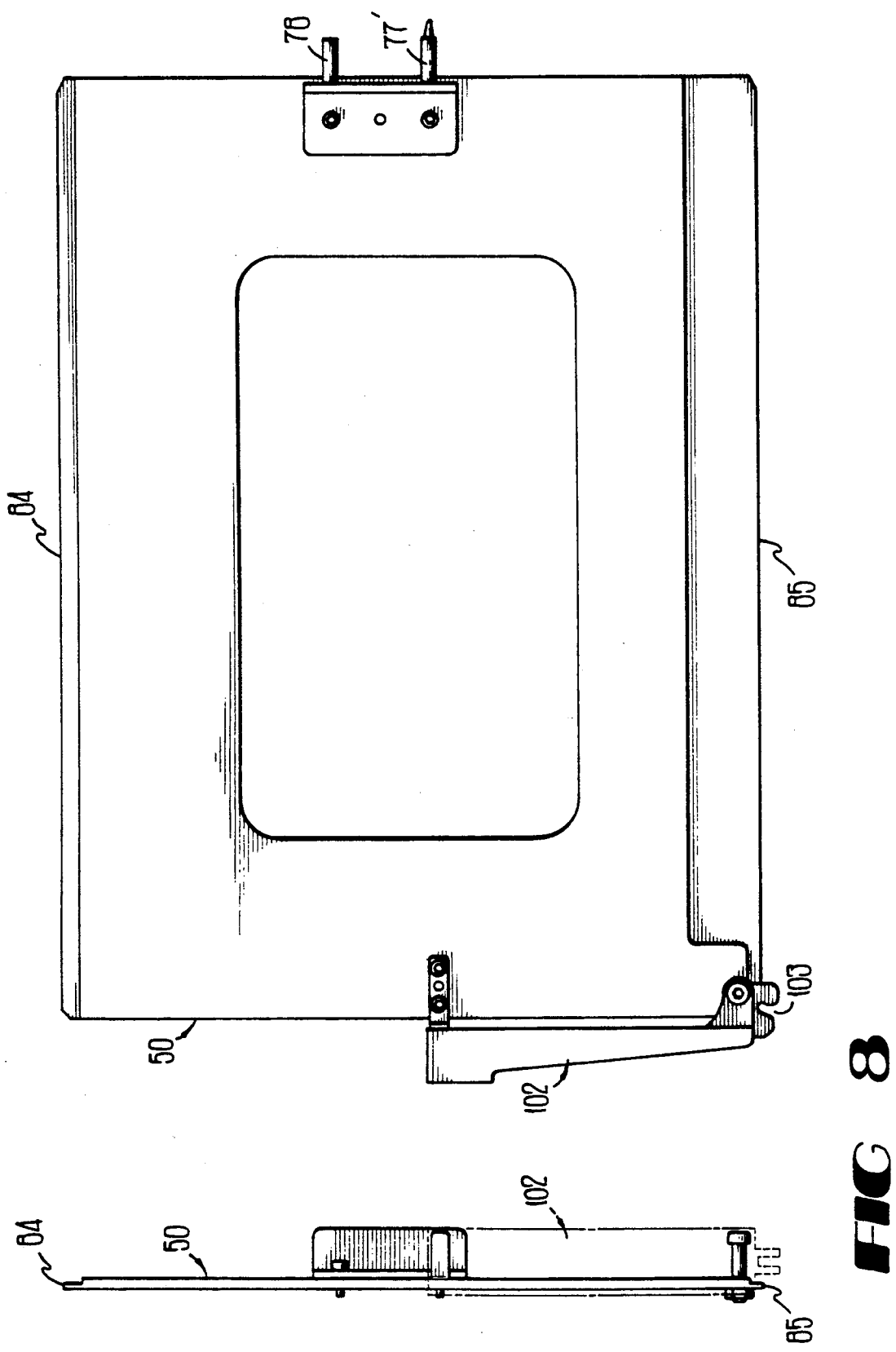

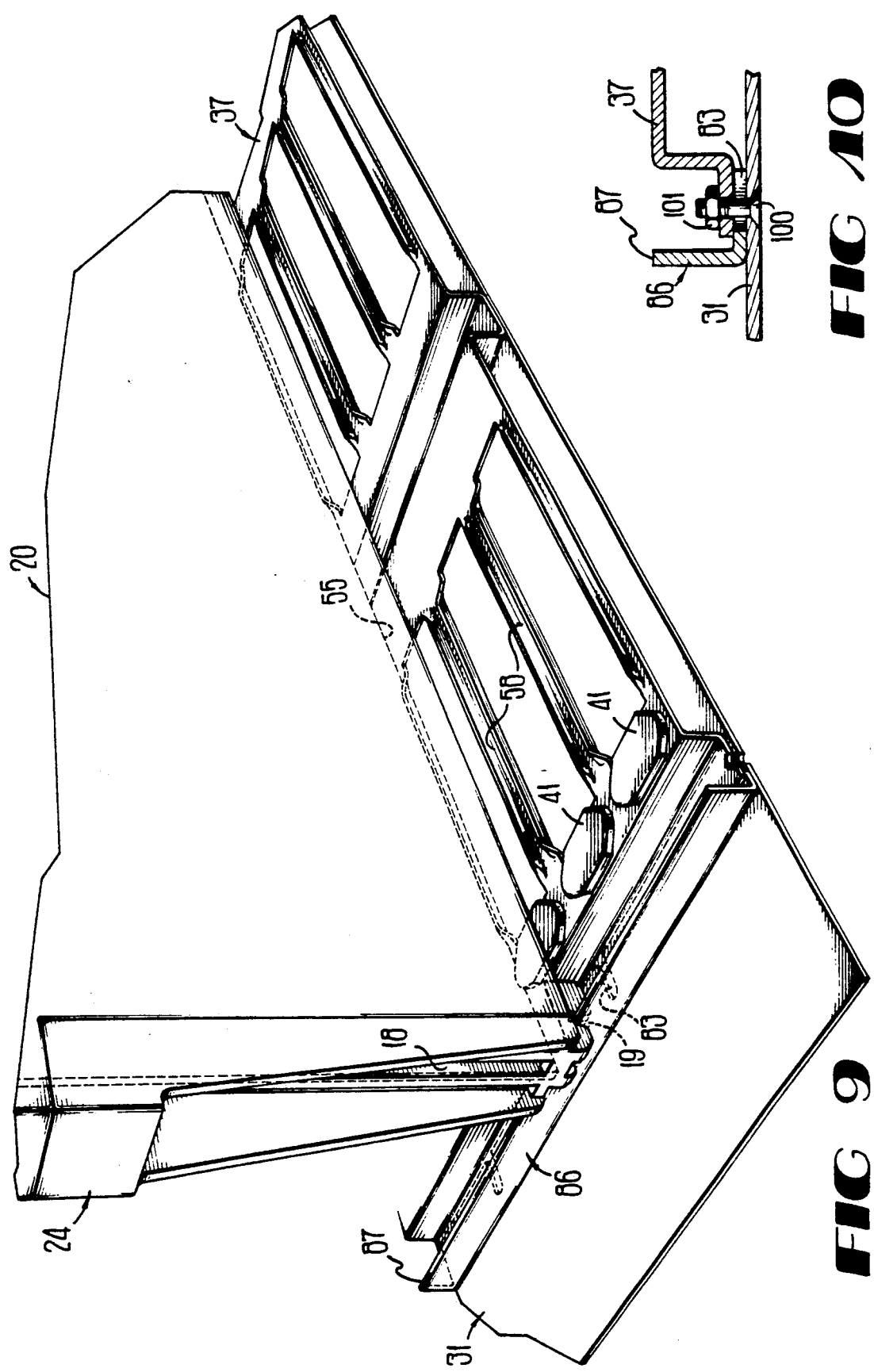

APPARATUS FOR RACK MOUNTING MULTIPLE CIRCUIT BOARDS

This is a division, of application Ser. No. 644,266, filed Jan. 22, 1991.

TECHNICAL FIELD

The present invention relates generally to rack mountable equipment, and particularly relates to an apparatus for rack mounting electrical circuit boards, which includes an improved enclosed rack mount system, an improved ventilation configuration, improved means transferring heat from power supplies on the apparatus, and improved means for aligning mechanically critical components of the apparatus.

BACKGROUND OF THE INVENTION

In computer operation, it is often desirable to utilize modems, which allow a computer to send and receive data across conventional telephone lines. As known in the art, and to most users of computers, modems (a contraction for modulator/demodulator) are devices which convert digital signals from a computer or terminal into a modulated signal appropriate for transmission across conventional telephone lines. Most modems use a modulation technique which is appropriate for transmission over the relatively narrow usable band width of conventional phone lines.

For many years the mounting of electrical equipment such as modems on supporting frames commonly referred to as racks, has been a popular way of housing the equipment for good ventilation, access to circuitry, assistance in the rapid changing of sub-assemblies, and generally convenient use. Typically the racks include a single cavity which includes a plurality of slots into which the equipment may be inserted. For example, in the United States, the electronic industry association's standard nineteen inch-wide rack configuration has been in use in hundreds of thousands of installations, both laboratory and commercial. Other racks known as "card cages", used for many years in telephony and more recently with respect to computing equipment, have become important means for providing rack mounting. Card cages are known in the art as box-like structures which have guide slots (typically two cofacing slots) for holding the edges of a plurality of circuit boards, also known in the art as "cards" which normally slide in from the front of the cage and have connectors on the rear edges of the circuit boards which mate with compatible connectors permanently attached to the back of the rack or a back plane within the card cage. Most card cages have tended to be open, and relied on either natural convection, or forced convection through ventilation fans.

More recently, racks have been equipped with integral components such as AC outlet strips, ventilation fans and internal power supplies and have employed in a variety of applications. However, for the most part, the use of such rack mounted equipment has been limited to laboratories or technical equipment rooms because it is generally considered to be aesthetically unappealing and thus unacceptable for use in office areas or other professional sites.

In configurations such as racks which require careful construction and assembly in order to provide precise interaction between various elements, a main concern is that of manufacturing and assembly tolerances. Should a device not be manufactured or assembled as required, the device may not operate in the intended manner or may be damaged even by proper handling or operation. In configurations such as electrical component racks as described above which require circuit board enclosures to be slid into various slots resulting in an electrical connection, such assembly concerns are amplified. Not only is there a concern that the connections are made along the desired axis of connection to avoid damage due to pin misalignment or the like, but the connectors must be fully engaged along their axis of engagement, in order to assure optimum and reliable electrical transmission. Once again this concern is paramount when the devices may be used by unskilled or careless personnel.

As the circuitry used to operate modem circuit board circuitry must operate on voltages differing from 120 or 220 volts AC, it is at times necessary to provide voltage convertors or "power supplies" as referred to in the art, for converting such higher voltages to the desired lower operating voltages for operation of the modems. Due to efficiency limitations inherent in such converters, some electrical energy is lost as heat during the voltage conversion process. In order to prevent damage to such units due to overheating, it may advantageous to provide a "heat sink", to allow heat to be transferred from the power supply.

Heat sinks are known in the art as means for facilitating the transfer of heat away from a particular "hot" object, such as a resister or coils from a power supply. By providing a low path of thermal resistance between the heat sink and the hot object (such as direct contact), heat may be transferred to the heat sink, and transferred therefrom by other means known in the art.

One means for providing a heat sink in apparatuses which include framing members is to attach the item to be cooled to one of the framing members, thus allowing the framing member to act as a heat sink. However, to assure the transfer of heat it is important that sufficient contact be made between the object to be cooled and the heat sink. Such contact is normally done by providing fasteners such as machine screws or rivets to rigidly and securely fasten the two members, thus providing the desired intimacy of contact between the two members.

The disadvantage of such connections is that they do not provide for a simple "quick-disconnect" configuration which may be desired if the connection is one that must be made repeatedly (such as is the case for interchangeable configurations) or must be made by unskilled personnel.

As discussed above with respect to power supplies, a need is also recognized in the art to provide cooling ventilation for circuit board assemblies, namely the components mounted on such circuit boards. This is especially the case for boards having a high resistor population, as in these components energy is necessarily converted from electrical energy to thermal energy. Therefore, a need is recognized in the art to provide means for cooling circuit boards. In order to prevent such overheating, prior art rack mount arrangements have provided for ventilation by natural convection, by leaving the racks relatively exposed to the operating atmosphere, or have provided forced convection ventilation by the use of one or more fans to draw air in from a normally open bottom or other opening through the entire cavity enclosed by the rack assembly.

However, such configurations have tendencies to draw ultimately large volumes of air through open unpopulated portions of the card cage, sometimes at the expense of adequate air flow over the boards in the populated portions of the cage. This has normally not been a problem in the prior art because the card cages have tended to be unenclosed circuit boards that allow adequate air to flow over the components even under widely varying conditions of the percent of the circuit card slots which are populated. However, this may be a problem when it is desired to use enclosed circuit boards within the cage, as such enclosed circuit boards necessarily introduce obstructions in the path of the ventilating air.

Therefore it may be seen that there is a need for an improved rack configuration for mounting multiple circuit boards. There is a particular need for such a unit which incorporates improvements in heat sinking, adjustability, and ventilation.

SUMMARY OF THE INVENTION

The present invention provides an improved rack configuration for mounting multiple enclosed circuit boards. The rack assembly includes multiple advantages over the prior art, including improvements in heat sinking, relative adjustability of various elements of the rack after assembly, and ventilation of the rack during operation in an efficient manner.

Several design features of the present invention were made in response to problems which arose in order to implement some novel requirements of the modem rack system for which the preferred embodiment disclosed herein was designed. These novel requirements may or may not form a part of the present invention, but an understanding of same will be useful in understanding the needs which gave rise to some aspects of the present invention and the problems presented by those needs.

In designing the present invention, one aspect of the electrical design was to provide a novel rack communication system for modems, including at least one controller circuit board, at least one power supply, and at least one modem circuit board, with the capability of including two power supplies, two controller circuit boards, and sixteen modem circuit boards. Through means of a back plane, each controller circuit board was to provide all outgoing serial data to the modems on the modem circuit boards in the rack and accept all incoming serial data from the modem circuit boards. The controller circuit board also was to assemble packets of incoming data for transmission, again through a back plane, to a packet oriented local area network for connection to a utilization device such as a mainframe computer. Similarly, the controller was to receive incoming packets of data and distribute them appropriately, according to information contained in the packet, to individual modems within the rack.

The above design considerations led to an arrangement in which the usual collection of serial ports are absent from the modems in the rack, instead allowing the telephone line connections to individual modems and the modem circuit boards to be made through multi-conductor telephone cables terminated in multi-conductor telephone receptacles of the type often used with large key sets. In the preferred embodiment, two 50 conductor plugs are provided and extend from the back plane toward the back of the rack assembly.

As discussed above, all serial data communication between the modem circuit boards and an external device communicating with the modems is provided through a conventional packetized data local area network. In particular, embodiments of this system have been designed to interface all of the modems in the rack to a mainframe computer via a single token ring network node constructed according to the IEEE 802 series standards. The system housed in the preferred embodiment of the present invention has four modems per modem circuit board for a possible total of 64 modems in a fully populated rack. Another optional addition to this embodiment, discussed in further detail below, provides for data transfer between a computer and the modems via an ETHERNET-type local area network.

Therefore, instead of providing 64 RS-232 serial connectors, each of which requires a relatively expensive cable to be provided to a like port on a computing or multiplexing device, all of the serial data may be transferred in data packets between a computer and the modems. Instead of individual telco connections for each modem, two 50 conductor plugs are provides so that 64 tip ring pairs can be provided to the rack through two cables. This reduces cost and clumsiness of the cabling system, reduces the number of components likely to fail, and significantly reduces the hardware requirements for providing multiple serial ports on the computing device communicating with the modems.

However, it will be readily apparent that the price to be paid for this convenience is the necessity for software operating both the controller circuit board of the rack and the computer to which it is connected, which assembles and disassembles the data packets passed back and forth between the two devices. The software must provide information on the particular modem from which data is received or for which data is provided. Also, software must be provided to handle the multiplexing aspects providing the chunks of data on a conventional packetized network.

Should particular customers not desire to use implement such operating software, the present invention nevertheless allow the rack apparatus to be used in more conventional installations, by means of optional extender circuit boards designed for providing conventional telephone and serial port connections. In other words, extender cards are provided, which can be attached to each modem circuit board module, which will bring out four RJ-11 -type telco connectors and four serial port connectors to allow the modems to operate in a substantially conventional manner. In such configurations, the controller circuit boards may provide configuration data to the modems and will perform diagnostics to look for trouble on particular modem circuit boards. However, it may be seen that when the extender cards are inserted, each of the four modems on each modem circuit board is functioning substantially as a conventional individual rack modem with separate physical telco and serial port connectors. This requires a rack arrangement which can provide critical alignment of the extender cards with the modem circuit boards.

As discussed above, the back plane provides electrical interaction between various circuit boards, mounted in a side-to-side rack configuration. Therefore it may be seen that alignment of the circuit boards relative to the back plane is necessary for proper operation of the rack. Thus the present invention provides an advantageous adjustable rack configuration which contemplates the use of fixtures, having critical dimensions, which are inserted into the rack in a particular manner such that the rack apparatus may be adjusted to accept the fixtures in a desired manner. Once the rack apparatus is adjusted by use of the fixtures, the fixtures are removed, and enclosed circuit boards having known dimension characteristics may be inserted in a safe and reliable manner into the rack without fear of damaging the enclosures or the rack.

The further requirement of extender cards also led to problems for assembling the rack wherein the extender cards would be properly aligned with the installed modem circuit boards. Therefore the present invention provides an adjustment feature which not only adjusts the desired position of the back plane relative to the modem circuit board supporting slots, but also provides simultaneous adjusting of an upper extender card mount used to support the extender cards. Holes are provided in the bulkhead which allow an extender card mount to "float" along with the back plane during its adjustment, thus providing an effective means of providing desired adjustment of the back plane and expander card mount relative to the frame of the rack assembly.

The present invention also overcomes disadvantages in the prior art by providing a power supply mounting configuration which allows the power supplies to be readily mounted and dismounted, with means for providing close contact between the power supplies and a frame member used for heat sink purposes. A unique configuration is provided which allows the power supplies to be inserted into place such that close metal-to-metal contact is achieved between a portion of each power supply and its mount, thus allowing the power supply mount to also act as a heat sink.

The air flow characteristics provided by the present invention are also important features of the present invention. As discussed above, inventors of the present invention set out to design an improved rack mount apparatus according to various design criteria. First and foremost, it was considered important to have operation and low level servicing of the rack be done by virtually anyone. In other words, the specific design goal was prevent persons having virtually no technical training or understanding of the potential sensitivity of some electrical devices from improper touching of the components on a particular circuit board. This led to a design decision in favor of enclosed circuit boards. Enclosing the circuit boards in individual cases eliminates many of the problems of improper handling by untrained personnel, and also reduces the change of injury or discomfort to the personnel due to exposure to sharp components protruding from the circuit boards. However, this design criteria has the potential to create serious problems with respect to adequate ventilation. In particular, it was found more difficult to assure adequate ventilation of the components on individual circuit boards when the boards were individually enclosed and the rack was only partially populated. In other words, the mechanics of the fluid flow of the air through a front opening of the rack tended to cause the air to flow mainly through the unoccupied spaces and to restrict flow through the individual board enclosures in a manner that let to potentially serious overheating problems.

In keeping with the design criteria of easy serviceability by untrained individuals, it was also decided to provide selectively insertable modular power supplies in the rack system of the present invention. In keeping with the concept of providing ease of serviceability, guide rails were provide to facilitate insertion of each power supply to make sure that the connector on the power supply supporting tray mated with connector at the back of the power supply. However, potential overheating problems were detected since such a power supply suspended on guide rails had to rely completely on the flow of air through that portion of the rack for heat dissipation.

Therefore the inventors conceived of the present invention, which provides a unique ventilation system which provides constant, reliable ventilation of the power supplies used in the rack, and also provides ventilation of any circuit board enclosure assemblies which are inserted into place in the rack, without needlessly ventilating rack spaces which are unoccupied.

With respect to the cooling of the power supplies, the present invention provides a configuration which allows the power supplies, basically including internal components and an exterior shell, to be positioned within a continuously ventilated upper cavity defined by a rack apparatus ventilated not only on the outside of the shell, but through the shell. To further assist in cooling, a unique configuration is provided which allows each power supply to be releasably fixed in place with one planar side being in closed biased contact with another planar surface defined by a portion of the frame of the rack apparatus, thus allowing some heat to be effectively transferred to the frame and away from the power supplies.

With respect to the enclosed circuit board assemblies installed in the lower cavity, a novel ventilation scheme is provided which includes selectively movable doors between the upper cavity, continuously exhausted by the rack's ventilation fans, and a lower cavity housing the modem and controller circuit boards used in the preferred embodiment. According to a preferred form of the present invention, a series of doors are pivotably mounted about a common transverse axis. Under the force of gravity, each of them will normally be closed, the end opposing the pivoting end resting on a surface, so that no air will pass from the lower cavity into the upper cavity except that allowed to pass by small gaps between adjacent doors. A cam is provided on the lower side of each door which engages an edge of the inserted circuit board. In the preferred embodiment, when the inserted enclosed circuit board is inserted into the lower cavity, the cam surface engages the edge of the enclosure. The engagement between the cam surface and the edge of the enclosure forces the door open, thus providing a fluid path from within the circuit board enclosure to the upper cavity from which air is being extracted by ventilation fans. Since the individual circuit boards used in the preferred embodiment are enclosed, with vents at the front and an exit vent positioned to be under the position of the door when the enclosure is fully inserted, air is drawn through the front vents of the enclosure, over electrical components on the circuit board within the circuit board enclosure, out of the exit vent and into the upper cavity.

Using this system, the main air flow from the lower cavity into the upper cavity will only pass through circuit board enclosures which have been inserted into the lower cavity. The doors for the unoccupied spaces will remain closed and thus no air will pass through these areas, save that which passes through the small spaces between adjacent doors. However, a sufficient amount of air will continue to flow past and ventilate the power supplies, which are positioned within the upper cavity.

Therefore it may be seen that the present invention provides an improved rack configuration for mounting multiple enclosed circuit boards. The rack assembly includes multiple advantages over the prior art, including improvements in heat sinking, relative adjustability of various elements of the rack after assembly, and ventilation of the rack during operation in an efficient manner.

Therefore it is an object of this invention to provide an improved apparatus for rack mounting multiple circuit boards.

It is another object of this invention to provide such an apparatus for rack mounting multiple circuit boards which are individually enclosed.

It is another object of this invention to provide such an improved apparatus which includes an improved means for adjusting various elements of the apparatus in a desired manner after the apparatus is assembled.

It is another object of this invention to provide such an improved apparatus in which multiple enclosed circuit boards mounted within the apparatus are ventilated properly.

It is another object of this invention to provide such an improved apparatus which includes an internal power supply, and an improved means of providing needed heat sinking for the power supply.

BRIEF DESCRIPTION OF THE DRAWINGS

FIG. 8 is a side elevation view of a fixture used to provide relative adjustment of various elements of the embodiment shown in FIG. 1.

FIG. 9 is an isolated pictorial view of a portion of the embodiment shown in FIG. 1, illustrating the installation of an installed enclosed circuit board assembly.

FIG. 10 is a right isolated elevation view of a portion of the embodiment shown in FIG. 1, further illustrating the installation of elements shown in FIG. 9.

DETAILED DESCRIPTION OF THE PREFERRED EMBODIMENTS

As was done in the Description of the Drawings, reference will be made to terms such as "front", "rear", "left", and "right". However, it should be understood that such terms are relative and are used for the sake of effective explanation only, and should not be interpreted as limitations on orientation of the claimed invention.

Figure 1:
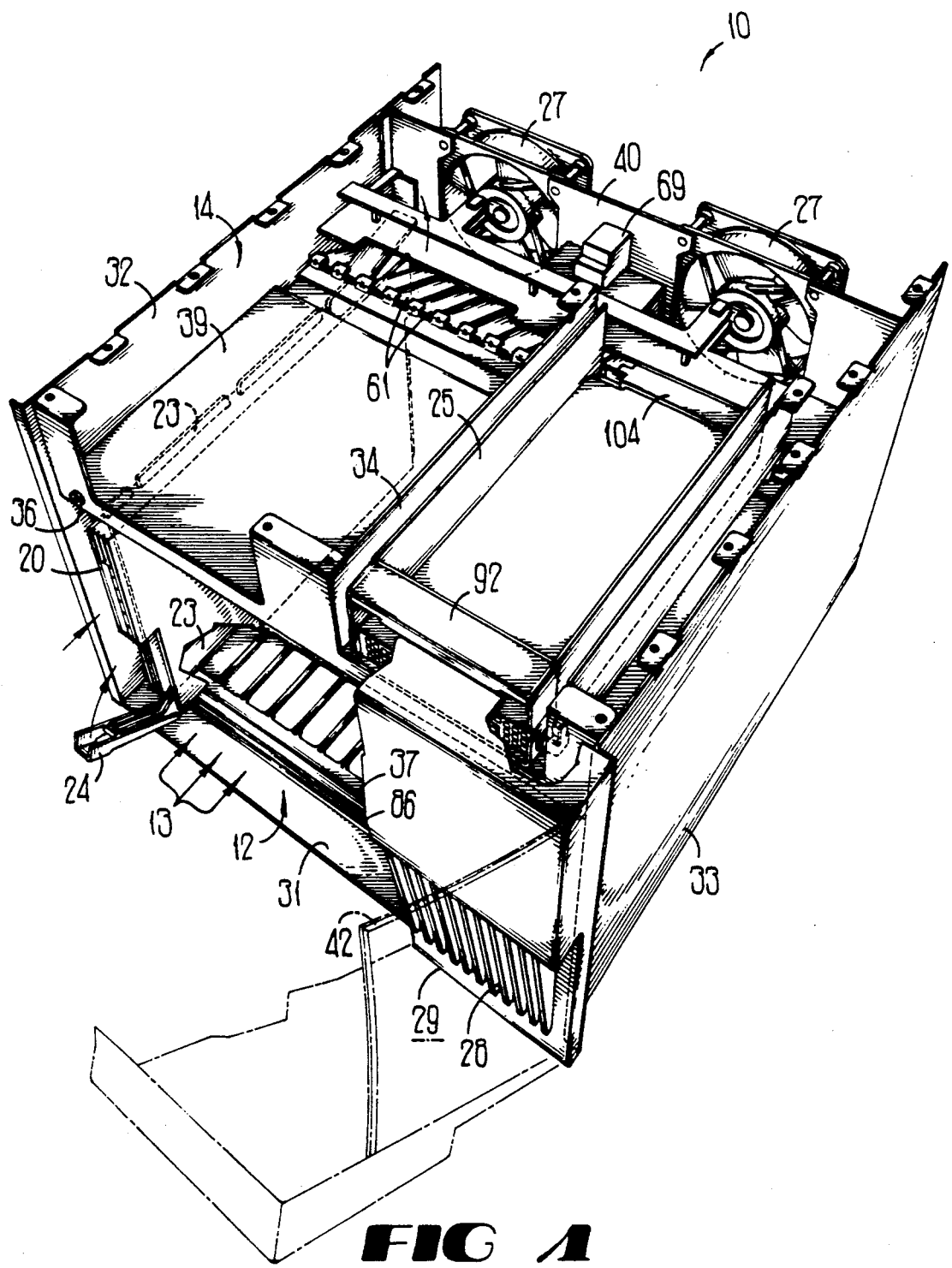
FIG. 1 is a pictorial view of a preferred embodiment of the rack apparatus embodying the present invention, with the top cover panel removed, only one power supply in place, and other elements shown in cutaway for clarity.
Figure 2:
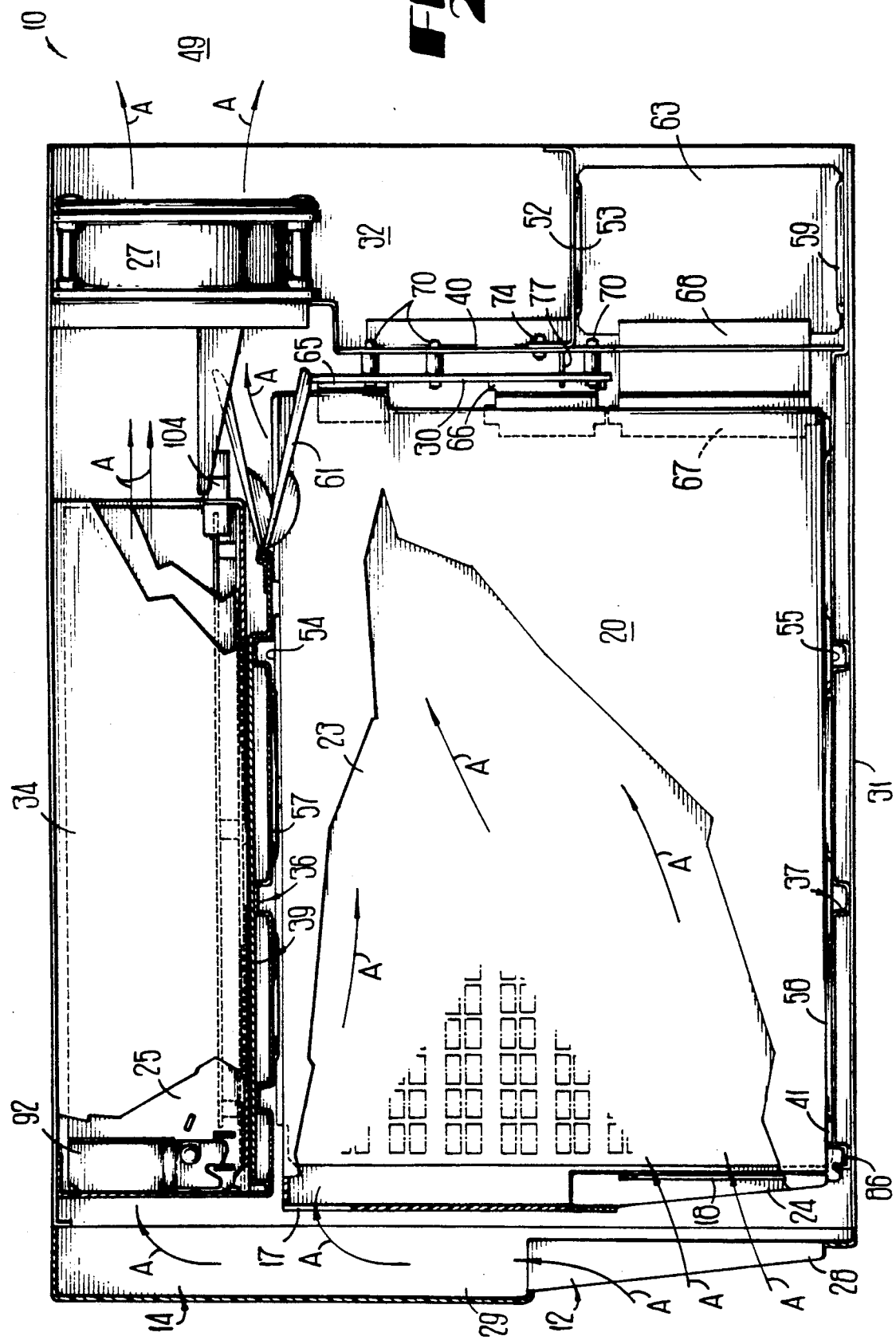
FIG. 2 is a side partial cutaway elevation view of the embodiment shown in FIG. 1.

Referring now to the drawings in which like numerals indicate like parts, the overall assembly shown in FIGS. 1 and 2 is referred to as apparatus 10. The apparatus 10 defines a lower cavity 12 including a plurality of spaces 13 into which enclosed circuit boards 23 may be placed in a side-to-side manner, with the primary planar surfaces of the circuit boards being preferably substantially vertical and coparallel. Each enclosed circuit board 23, when installed, interacts with a back plane 30 by means of electrical connectors to provide a plurality of electrical connections between the back plane and the circuit boards.

Power is provided to the circuit boards by means of a pair of voltage converter assemblies 25 (See also FIG. 16) which may also be known in the art as power supplies 25. Each power supply 25 is selectively removable from the assembly 10. A unique slide-in configuration, discussed in detail later, is provided which allows each power supply 25 to be installed into close contact with its mount for effective dissipation of heat.

Referring now to FIG. 2, during operation of the apparatus 10, air is circulated in and out of the apparatus by means of a pair of continuously operating fans 27. The fans 27 draw air in through a front access door vent 28, and then past the power supplies 25 for a ventilating effect. Should any enclosed circuit board assembly 20 be installed in any slots of the lower cavity 12, air is also circulated through those assemblies as discussed later.

Referring now generally to FIGS. 1-6, the apparatus 10 also includes left and right side panels 32, 33, respectively, a pair of trays 34 each for accepting and supporting a corresponding power supply 25, an upper enclosed circuit board guide 36, a lower enclosed circuit board guide 37, and a bulkhead 40.

The apparatus 10 defines two main inner cavities: an upper cavity 14 and a lower cavity 12. The upper cavity 14 includes two exit ports each having an in-line fan 27, such that air may be drawn out of the upper cavity by the fans and blown into the outside atmosphere of the apparatus 10.

Figure 5:
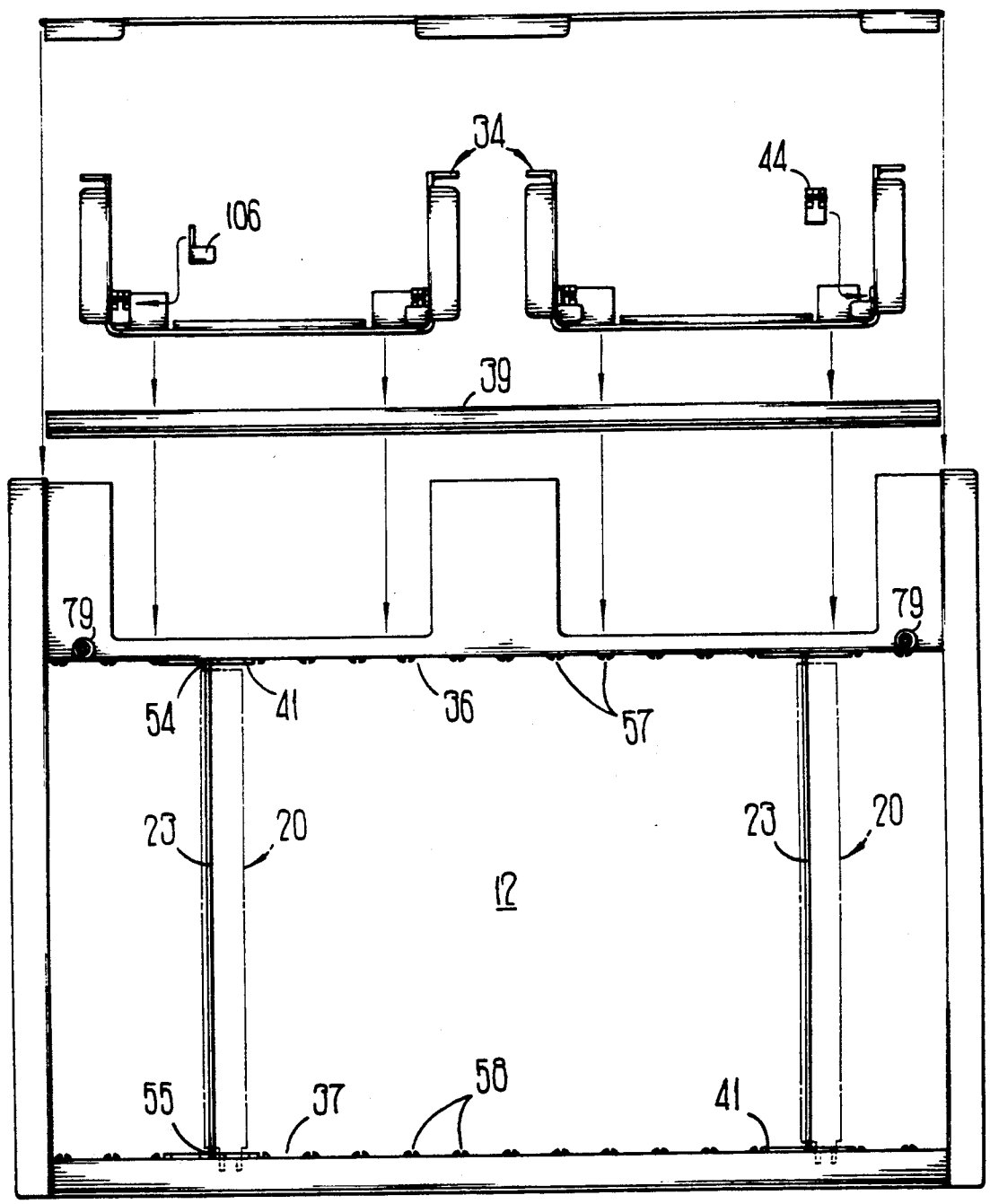
FIG. 5 is a front partial assembly elevation view of the the embodiment shown in FIG. 1.

As shown in FIGS. 5 and 9, apparatus 10 accepts a plurality of enclosed circuit board assemblies 20 each including a circuit board 23, a foil side cover portion to cover the foil side of the circuit board, and a component side cover portion to cover the component side of the circuit board. The circuit board 23 may be of several types, such as a modem-type circuit board, or a "controller"-type circuit board, which may provide diagnostics or various control functions for the apparatus 10 as discussed above. As discussed in further detail later in this application, the enclosed circuit board assemblies 20 including controller circuitry are placed in two selected spaces 13 in the lower cavity 12, while the enclosed circuit board assemblies 20 including modem circuitry are placed in the remaining sixteen spaces 13.

The interaction of the various elements of the enclosed circuit board assembly 20 may be constructed similarly to that set forth in the disclosure of U.S. Pat. No. 4,716,499, entitled "ENCLOSED CIRCUIT BOARD ASSEMBLY" issued Dec. 29, 1987, incorporated by reference, or alternatively may be constructed as known in the prior art. However, is should be understood that it is preferable that each enclosed circuit board assembly 20 defines a rear exit vent hole 16, an upper front vent hole 17, and a lower front vent hole 18, each of which allow air to pass from outside the enclosure to inside to enclosure, and vice versa. Furthermore, the enclosed circuit board assemblies 20 each include a pivotably mounted inserter/extractor handle 24, to facilitate insertion and extraction of the enclosed circuit board assemblies into and out of the spaces 13 as discussed below. As shown best in FIG. 9, the handle assembly defines the lower front vent hole 18.

Referring to FIGS. 1, 2, and 5, the lower cavity 12 is immediately below the upper cavity 14, and is configured to accept a plurality of enclosed circuit board assemblies 20 in corresponding spaces 13, such that the primary planar surfaces of the circuit boards are substantially parallel. Such mounting is provided by means of upper and lower enclosed circuit board guides 36, 37, positioned along the top and bottom, respectively, of the lower cavity 12. As shown in FIGS. 2 and 5, the upper and lower edges of each enclosed circuit board extend somewhat from the enclosure at locations 54, 55 respectively. These edges mate with corresponding upper and lower slots 57, 58 (see particularly FIG. 5).

As shown in FIG. 9, a plurality of guides 41 are positioned on the front of the lower enclosed circuit board guide, intermediate the longitudinal axis of the slots 58, in order to provide means for guiding the circuit boards into their desired position within the slots.

Each inserter/extractor handle 24 defines a slot 19 for accepting an upwardly extending lip 87 (See also FIGS. 9 and 10) of an adjustment angle 86 which extends substantially across the width of the apparatus 10 and has an L-shaped transverse cross section. The lower, horizontal, portion of the adjustment angle 86 is sandwiched between the lower enclosed circuit board guide panel 36 and the lower cover panel 31, and defines a plurality of open-ended slots 83 which have their open ends directed rearwardly. As shown in FIG. 10, a plurality of threaded screws 100 pass through holes in the lower cover panel 31, then through the slots 83, and finally through holes in the lower enclosed circuit board guide panel 37, to threadably engage captured nuts 101 attached to panel 36. Therefore it may be seen that the adjustment angle 86 may be adjusted front-to-rear by the method of loosening the threaded screws 100, sliding the adjustment angle 86 as desired, and retightening the threaded screws 100.

Figure 15:
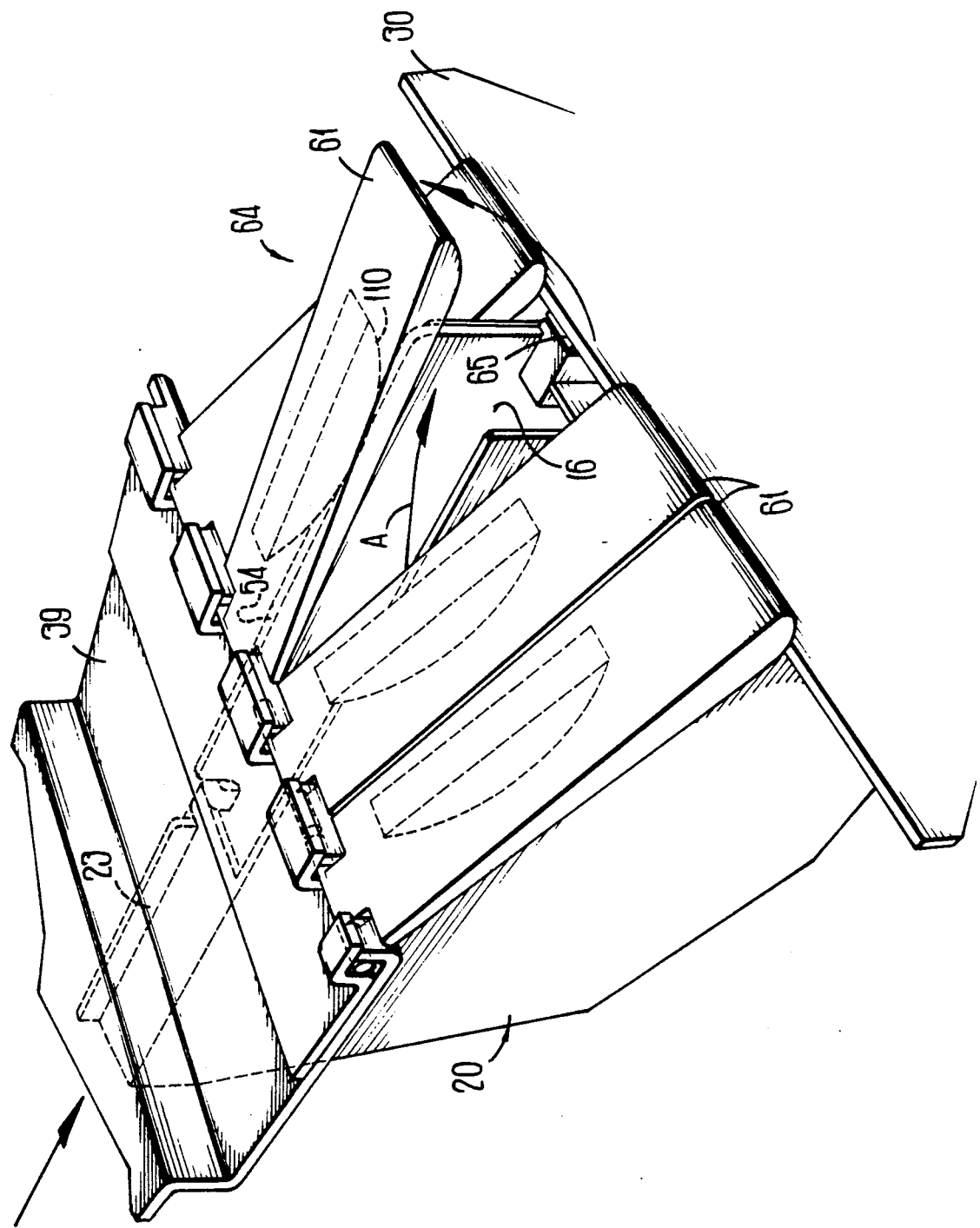
FIG. 15 is an isolated view of a preferred embodiment of the present invention, illustrating the pivoting action of a pivoting door when contacted by an enclosed circuit board.

As the upper enclosed circuit board guide 36 may include a plurality of openings intermediate the slots for manufacturing purposes, an air baffle 39 is provided above the guide 36 to substantially restrict the air flow between the upper and lower cavities 14, 12 through the slots. However, neither the baffle nor guide 36 extends all the way to the rear of the lower cavity, but an elongate gap 64 is left between the rear edge of the guide 36 and the upper edge of the back plane 30, as shown in FIG. 15. As discussed later in further detail, this gap 64 is covered by a plurality of independently pivoting doors 61 which allow selective ventilation to the enclosed circuit board assemblies 20 after their insertion into the lower cavity 12.

The apparatus 10 further includes a front access door 29 including a front access door vent 28. It should be understood that the door 29 may be opened, in order to provide access either the lower cavity 12, or the upper cavity 14. Thus, it may also be understood that the door 29 allows access to the power supplies 25 positioned in the upper cavity 14, and also the enclosed circuit board assemblies 20 within the lower cavity 12.

Figure 6:
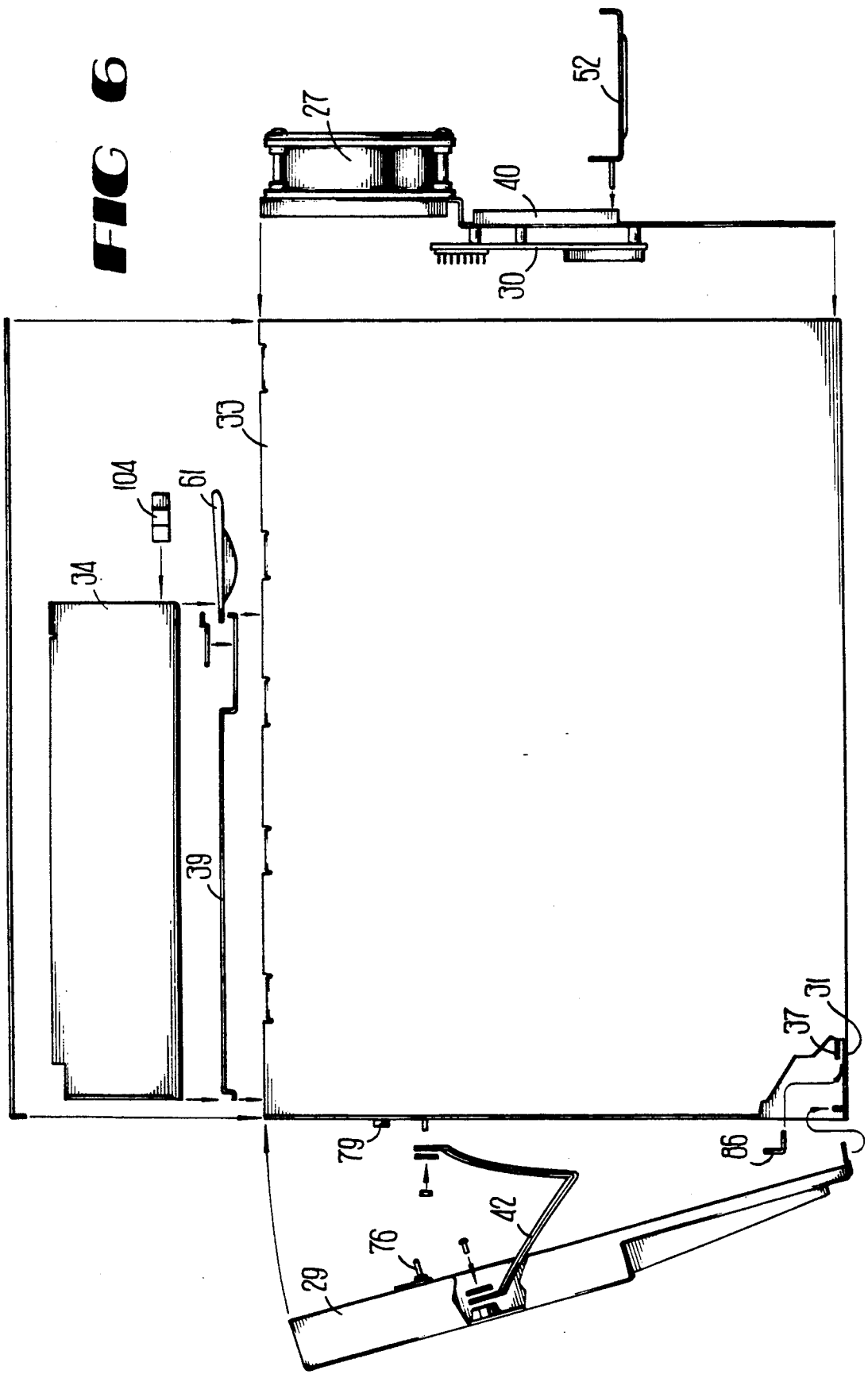
FIG. 6 is a left partial assembly plan elevation of the the embodiment shown in FIG. 1.

Referring now to FIGS. 1, 2, and 6, the front access door vent 28 provided in the lower portion of the front access door 29 allows air to enter from the outside atmosphere of the apparatus into the apparatus 10, illustrated in part by arrows "A" in FIG. 2. As discussed later in this application, after air enters at vent 28, a portion of its flow is directed through the upper cavity 14, in order to provide cooling ventilation to the power supplies 25. A portion of the air flow is also directed through any enclosed circuit board assemblies 20 which are in place in the spaces 13 in the lower cavity 12.

As shown in FIG. 1, a pair of fold-in straps 42 are provided on each side of the front access door 29. These straps 42 do not extend down in a vertical direction, but instead fold downwardly and also inwardly. It may be seen that such a configuration prevents the straps from being pinched by the door when it is closed. Also, the diagonal positioning of the straps 42 spreads out their interference with the air flow over several of the spaces 13 in the lower cavity.

A plurality of conductive gaskets (not shown) are provided about the inside periphery of the front access door 29, in order to provide a seal for reducing electromagnetic wave transmission as required by the FCC. It may be noted that each gasket is made up of an elongate resilient tubular member, which may be composed of rubber, though which an elongate wire is extended. The tubular member provides the electromagnetic sealing function, while the wire members, secured to the door at each ends, provide some structural integrity to the peripheral gasket, and likewise provide a means of securing the gaskets to the door. Each rubber gasket is cradled at various points along its length by small gasket cradles extending from the door.

Figure 14:
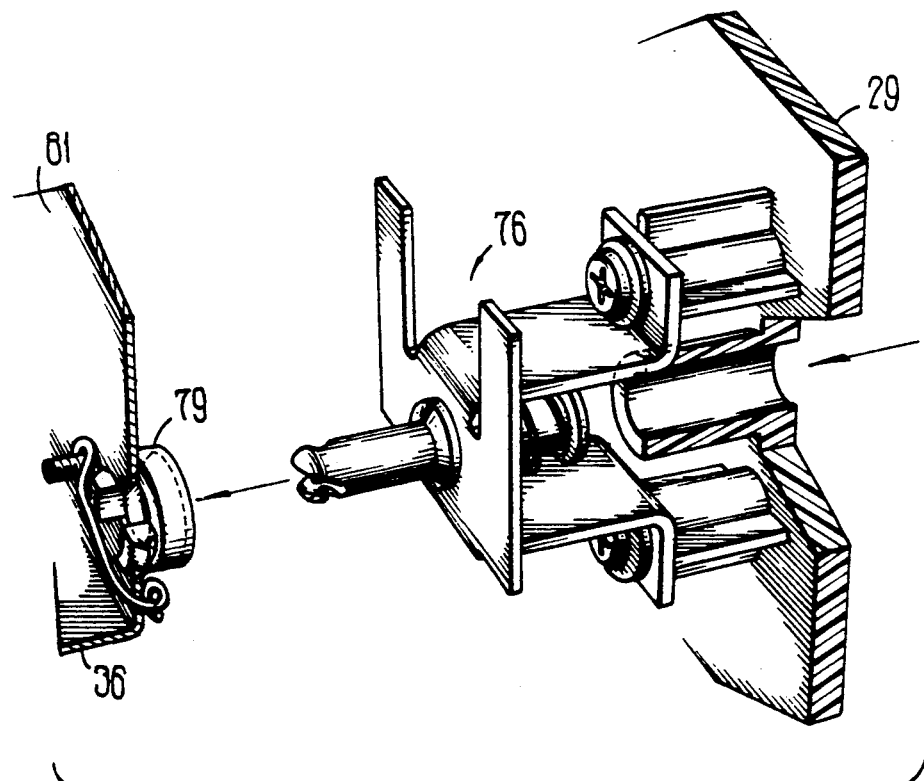
FIG. 14 is an isolated view of a latch assembly provided by the present invention.

As shown in FIG. 14, a quarter-turn fastener assembly 76, known in the art, is attached to the inside of the door 29. The fastener assembly 76 interacts with a tapered grommet 79 which is positioned about a hole defined by a planar portion of the frame of the apparatus 10. The tapered nature of the grommet 79 is improvement over the prior art, as it allows effective interaction between the frame of the apparatus 10 and the quarter-turn fastener assembly 76, in order to facilitate effective selective opening and closing of the door 29, even if the door is somewhat misaligned when installed. It may also be seen that the grommet provides a preferred tapered opening for accepting the quarter-turn fastener assembly 76, which could not be provided by sheet metal alone.

As shown in FIG. 2, a back plane 30 is provided at the rear of a lower cavity 12. This back plane 30 allows electrical connection between the power supplies 25, any enclosed circuit boards 23 positioned within the lower cavity 12, and telephone line connectors such as those known in the art. The lower rear of the apparatus 10 is configured such that each of the enclosed circuit board assemblies may interact with an extender card 63. The upper edge of the extender cards are captured by slots 53 defined by top extender card guide 52. The lower edges of the extender cards 63 are captured by rear slots 59 defined by the lower enclosed circuit board guide 37, which extends substantially the length of the apparatus 10 along the bottom of the apparatus 10. The rear slots 59 accept the card 63 in a manner similar to the method in which the lower slots 58 except the lower edges 55 of the enclosed circuit boards. The extender cards 63 extend through rectangular-shaped openings 56 defined by the bulkhead 40.

As discussed above, the enclosed circuit board assembly 20 as used in the preferred embodiment of the present invention may include modem circuitry or "controller" circuitry, which may provide diagnostic and/or control functions relative to the modem circuit boards and other elements of the apparatus. It should be understood that the enclosed circuit board assemblies 20 which include controller circuitry are intended to be inserted into the two leftmost spaces 13 of the lower cavity 12. Indicia "A" and "B" are provided in order to facilitate easy insertion of such enclosed circuit board assemblies 20 (See FIG. 4). Enclosed circuit board assemblies 20 which include modem circuitry are intended to be inserted into the rightmost (as viewed from the front) sixteen spaces 13, labeled "1"–"16", provided by the lower cavity 12. It should be understood that the preferred embodiment of the present invention contemplates the use of at least two enclosed circuit board assemblies 20, with one including controller circuitry and the other including modem circuitry. However, it should be understood that a vast array of other accommodations may be used, with the maximum number of enclosed circuit board assemblies 20 which may be placed in the present embodiment to be two assemblies having controller circuitry, and sixteen assemblies having modem circuitry.

Figure 4:
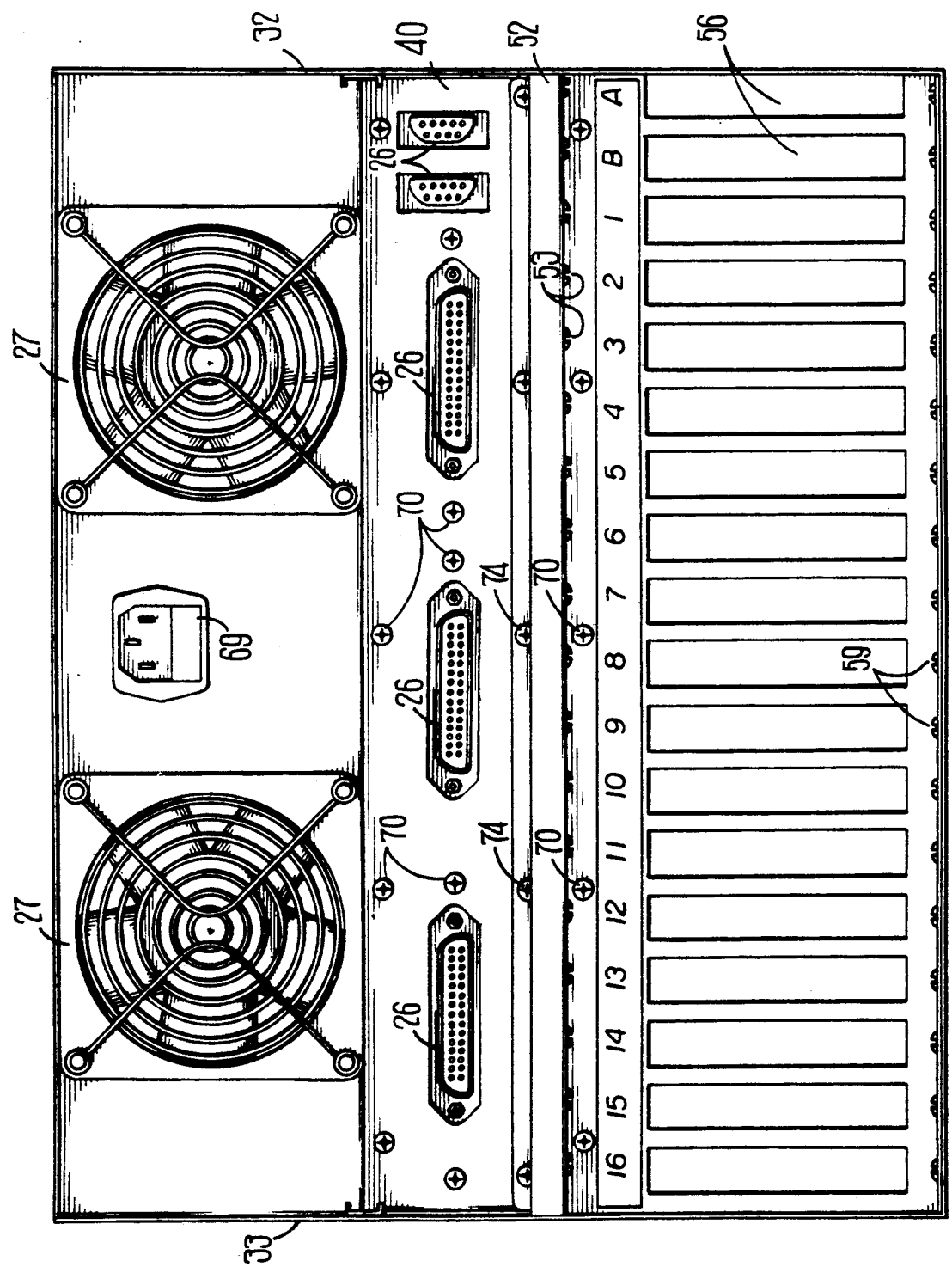
FIG. 4 is rear partial cutaway plan view of the embodiment shown in FIG. 1, with the enclosed circuit boards shown removed.

As shown in FIG. 4, token ring connectors 26 are also provided on the rear face of the back plane 30 to provide electrical interaction between the back plane and outside devices as discussed above.

As previously discussed, it may be understood that at the enclosed circuit board assemblies 20 may be inserted and withdrawn repeatedly from the overall apparatus 10, in some cases by unskilled personnel. Therefore it is important that the electrical connectors 65, 66 which extend from the rear of the enclosed circuit board assemblies, be properly aligned with mating connectors attached to the back plane, in order to prevent damage due to attempted coupling of the connectors while misaligned. Similarly, the extender cards 63 must be properly aligned with the enclosed circuit board assemblies 20 when they are installed, as critical electrical connections are made between these two elements via connectors 68, 67, extending from the extender cards 63 and the enclosed circuit board assembly 67 respectively.

As the apparatus includes a plurality of manufactured components which will require assembly, manufacturing and assembly tolerances would have to be critically monitored if the assembled assembly 10 configuration could not be adjusted after assembly. Such a configuration would result in unacceptable labor and tooling costs. Therefore, it was decided to provide adjustment of the relative positioning of the back plane 30 (which interacts with the circuit boards), and the upper extender card guide 52 (which holds the upper edge of each installed extender card), both of which are attached to opposing sides of the bulkhead. It was also decided to provide such adjustment from the rear of the device. It may be understood that access to the back plane 30 from the rear of the apparatus is severely limited as it is substantially concealed by the bulkhead 40. Furthermore, it is not practical to adjust the positioning of the bulkhead, as assembly considerations of the preferred embodiment require it to be substantially fixed in place.

Figure 7:
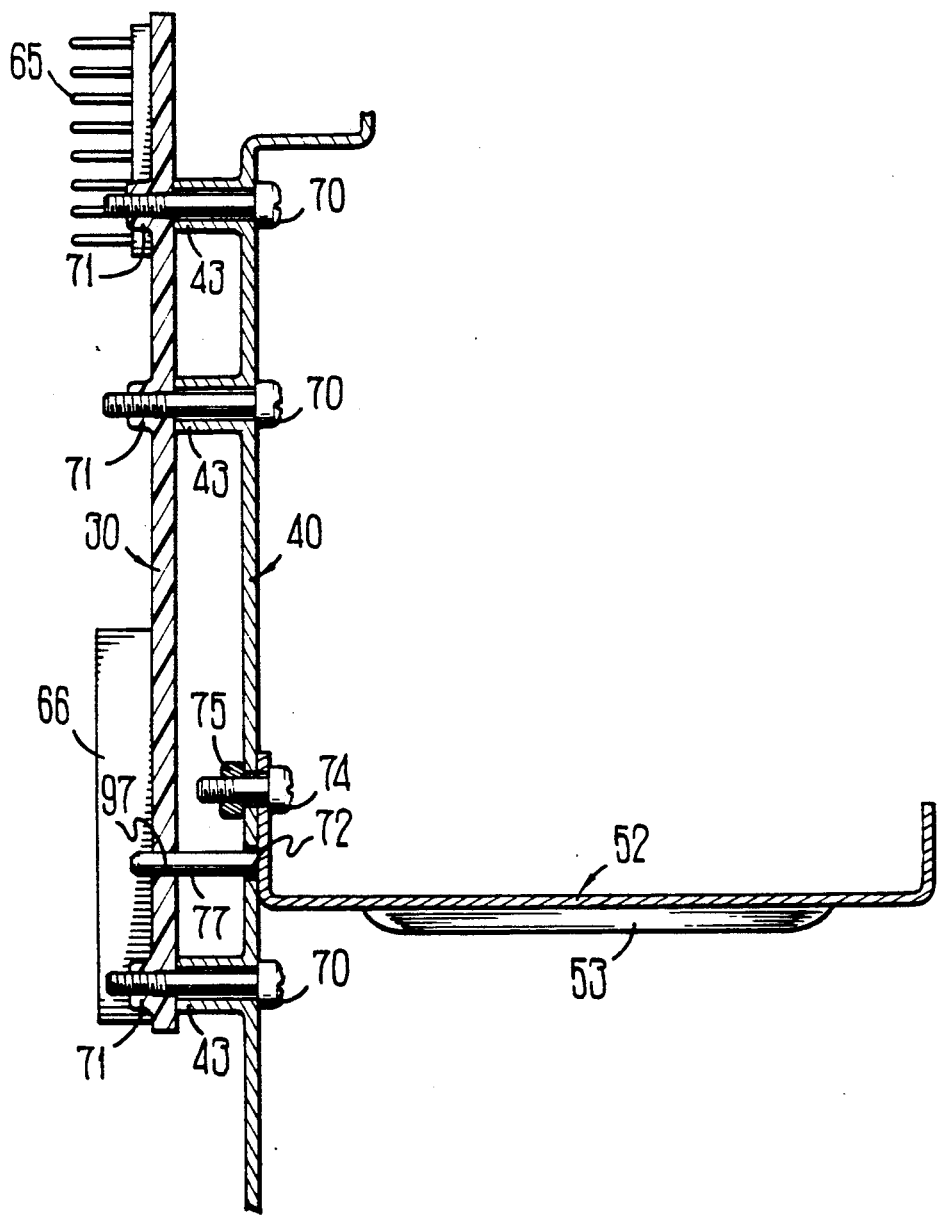
FIG. 7 is an isolated side partial cross sectional view of the embodiment shown in FIG. 1 showing the interaction of the back plane, bulkhead, and upper extender card guide.

As may be seen in FIGS. 4, 6, and 7, the back plane 30 is mounted in a stand-off manner adjacent to and in front of the bulkhead 40, and the top extender card guide 52 is attached to the back plane 30 on its rear side. Back plane adjustment fasteners 70 extend from the rear of the apparatus 10 towards the front, and extend through the bulkhead 40 in a loose-fitting manner, and likewise fit in a loose-fitting manner through stand-off tubular spacers 43 which extend from the front side of the bulkhead 40. The back plane adjustment fasteners 70 then extend through tight-fitting holes 97 defined by the back plane 30, to threadably accept captured fasteners 71 positioned on the front side of the back plane 30.

After the apparatus 10 is assembled but prior to final adjustment, it should be understood that the back plane 30 is loosely attached to the bulkhead 40 by means of the back plane adjustment fasteners 70. As there is some "play" between the fastener 70 and the bulkhead 40 due to their loose-fitting relationship, it may be seen that some play likewise exists between the back plane 30 and the bulkhead 40. As discussed later in this application, this play will allow desired adjustment of the back plane relative to the bulkhead, by use of a fixture 50.

As previously discussed, the top extender card guide 52 is attached to the rear face of the bulkhead, by means of adjustment fasteners 74, of which there are five as shown in FIG. 4. Also now referring to FIG. 7, adjustment fasteners 74 are oriented in the same direction as adjustment fasteners 70, and extend through a loose-fitting hole defined by the top extender card guide, then through a clearance hole defined by the bulkhead 40 and engage a captured nut 75 attached to the front face of the bulkhead 40.

Each of a pair of locating pins 77 is fixed to and extend from the top extender card guide 52 through a corresponding loose-fitting hole 72 defined by the bulkhead 40, and further extends into a corresponding tight-fitting hole 97 defined by the back plane 30. The function of the pins 77 is to provide accurate relative location between the top extender card guide 52 and the back plane 30, and the pins are preferably spaced apart as much as possible in order to provide an optimum location effect. The bulkhead holes 72 are large enough to prevent interference of the bulkhead 40 with the pins 77 during typical adjustment of the apparatus. It therefore may be understood that, as the back plane 30 may be adjusted relative to the bulkhead 40, so is the top extender card guide 52 adjusted relative to the bulkhead 40. This is desirable, as the enclosed circuit board assemblies 20 will be positioned as desired relative to the back plane 30, and the top extender card guide 52 will be positioned as desired relative to the enclosed circuit board assemblies. It should be understood that the upper and lower enclosed circuit board guides 36, 37, respectively, which hold the enclosed circuit board assemblies 20, are not normally adjusted relative to each other or the bulkhead 40 after initial assembly. However, it may be seen that, as the lower circuit board guide 37 includes lower slots 58 for supporting the lower edge of the enclosed circuit boards 23, and also includes lower rear slots 59 for supporting the extender cards, the integral nature of the lower circuit board guide encourages accurate alignment of the enclosed circuit board assemblies 20 relative to their corresponding extender cards 63, assuming the slots 58 and 59 are accurate in their relative positioning.

Adjustment of the relative positioning of the back plane 30, bulkhead 40, and top extender card guide 52 is now discussed. As discussed above, these elements are preassembled as shown in FIG. 7, except that the adjusting fasteners are not loosely fitted such that the three elements may be shifted somewhat relative to each other. Three fixtures 50 (see FIG. 8) are then inserted into spaces 13 defined by the lower cavity 12, much as would the enclosed circuit board assemblies 20, such that the top and lower edges 84, 85, respectively, of the fixture 50 fit within corresponding slots 57, 58, defined by the top and bottom enclosed circuit board guides 37, 36, respectively, and the fixture is locked into place by means of in inserter/extractor handle 102 similar in operation to the inserter/extractor handle of the enclosed circuit board assemblies 20.

The fixtures 50 are positioned into particular spaces, preferably one in the center and one on each extreme side of the lower cavity, and the position of the back plane is adjusted such that tapered pins 77 provide a self-locating fit within snug-fitting holes defined by the back plane 30. After the fixtures 50 are fully inserted and locked into their spaces by means of inserter/extractor handle 102, similar to those used on the enclosed circuit board assemblies, the back plane 30 is then in its desired position by reason of the locating effect of the pins 77 of the fixture 50. The back plane adjustment fasteners 70 are then tightened down such that the back plane 30 is secured to the bulkhead 40 in a desired manner.

Figure 3:
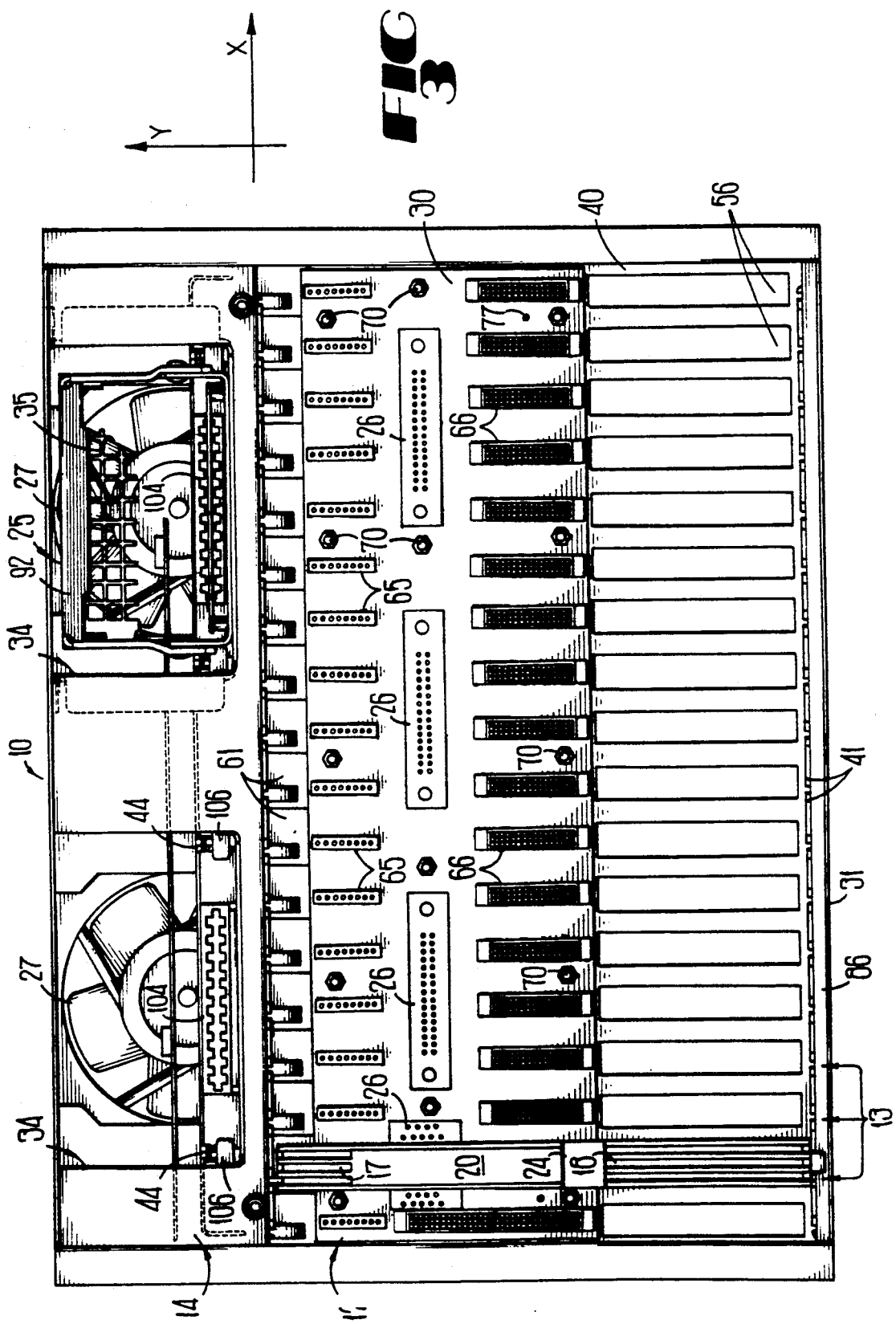
FIG. 3 is a front partial cutaway elevation view of the embodiment shown in FIG. 1.

In reference to FIG. 3, it may be said that the above adjustment to the back plane was made in the "X" and "Y" axes, with the "X" axis being horizontal, and the "Y" axis being vertical and perpendicular to the "X" axis. It should be understood that this is an adjustment which is made to the back plane 30 in order that connecting pin alignment will made as desired with the enclosed circuit board assemblies 20. However, an adjustment may also be made in a "Z" axis, substantially perpendicular to both the "X" and "Y" axes, this adjustment made to the desired final installed position of the enclosed circuit board assembles 20 along their slide paths. It may be understood that such adjustment is desirable, as the poor electrical connections between the assemblies and the back plane 30 may occur if the assemblies 20 are not inserted as far as they should be, and damage to the back plane may occur if the assemblies are urged too far into position. Once again, as unskilled operators may be installing the assemblies 20, this problem is of great concern.

Such adjustment in the "Z" direction is done by means of the adjustment angle 86 discussed above. When the two fixtures are inserted into place, the adjustment angle 86 is preferable in its previously-discussed "loose" state. The inserter/extractor handle 102 of each fixture is engaged, thus engaging the slots 103 about the lip 87 of the angle 86. At this time the adjustment angle is urged, preferably by manual pushing, as far as possible toward the rear of the apparatus, until the blunt pin 78 on each fixture 50, positioned immediately above the tapered pin 77, is firmly biased against the back plane 30. At this time the adjustment angle 86 is at its desired position due to the selected dimensions of the fixture 50, and the adjustment angle may then be secured in place. The fixtures 50 are then removed.

After the back-plane 30 is adjusted and secured as desired, it may be understood that the top extender card guide 52 is positioned as desired, due to the existence of the pins 77 which allows the top extender card guide to "float" along with the back plane 30, combined with the loose, non-interfering relationship between the pins 77 and the bulkhead 40. Therefore adjustment fasteners 74 may likewise be tightened as desired, thus fixing the top adjustment card guide 52 to the bulkhead 40 in the desired position.

As previously discussed, two power supplies 25 are provided in the apparatus 10. The circuitry of the each power supply may be such as that known in the art, with each convertor converting power supplied at a relatively high voltage supplied via connector 69 (See FIG. 4) to a relatively low voltage.

As shown in FIG. 3, each power supply 25, when installed, is positioned in front of a corresponding fan 27. Referring also to FIGS. 11A–C and 16, the exterior of each power supply 25 is substantially box-like in shape, having upper and lower planar surfaces 88, 89, respectively, and also left and right side planar surfaces 90, 91, respectively. Front and rear sliding tabs 94, 93, respectively, extend outwardly from each of the side surfaces 90, 91. A third support tab 95 is also provided on each side of each power supply, thus giving a total of three spaced apart tabs on each side surface.

Figure 16:
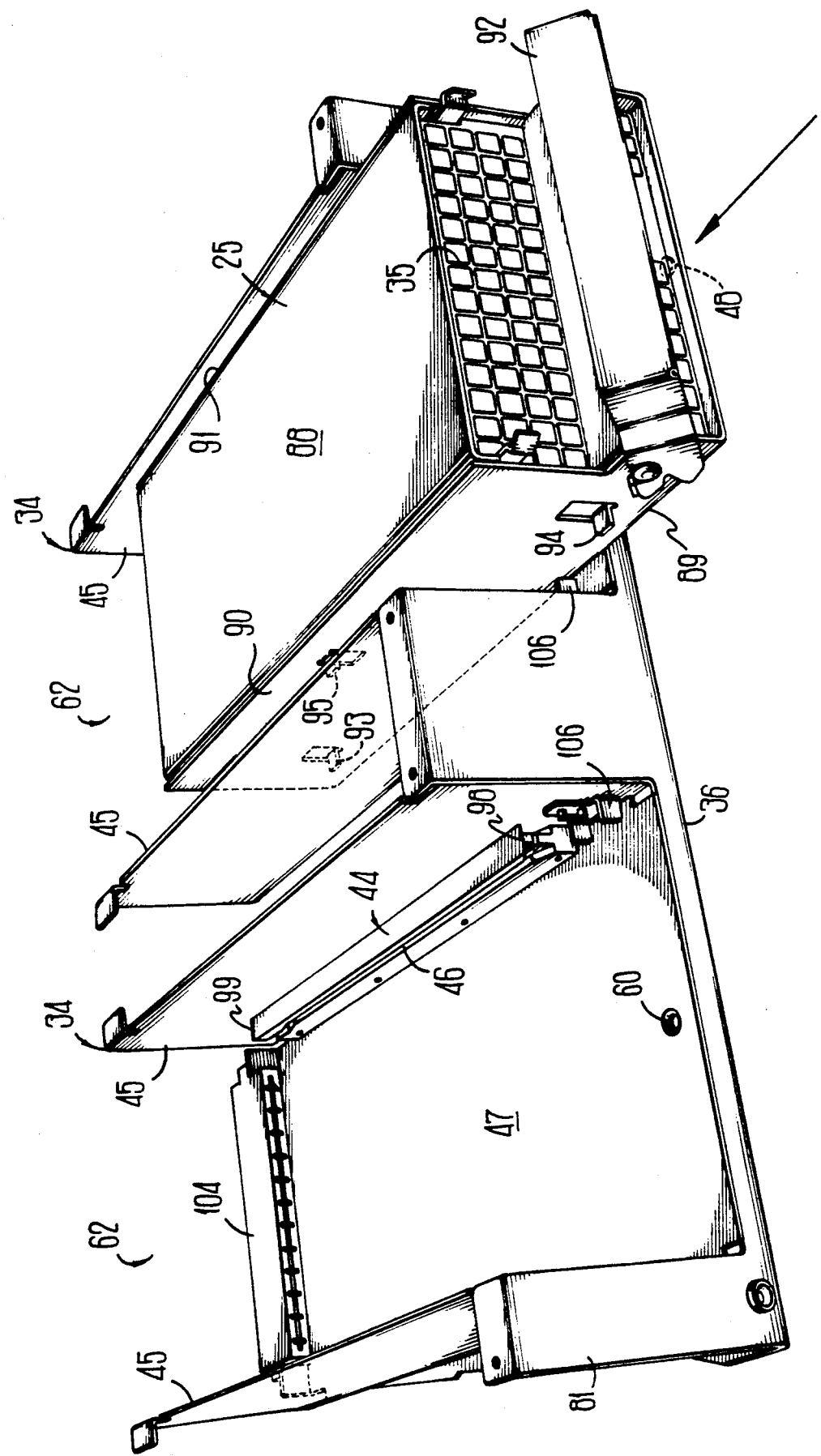
FIG. 16 is an isolated view of a preferred embodiment of the present invention, illustrating one power supply in place in one tray, with the other tray being vacant.

As shown in FIG. 16, the apparatus 10 also includes a pair of trays 34, which face upwardly and are each configured to accept a corresponding one of the power supplies 25, such that the primary planar surfaces of the sides of each power supply are substantially co-parallel, and also substantially parallel to the side panels of the apparatus 10. Each tray includes two side walls 45 and a lower horizontal supporting surface 47 having a planar surface substantially perpendicular to the planar surfaces of the side walls 45. The trays are attached to and supported by upwardly extending front flanges of the upper enclosed circuit board guide 36.

Elongate slotted guides 44 are positioned on and secured to each interior side walls 45 of each of the trays, are elongate slotted guides 44. The purpose of these guides 44 are to guide the power supplies 25 into their desired position during their installation as discussed below.

Figure 11A:
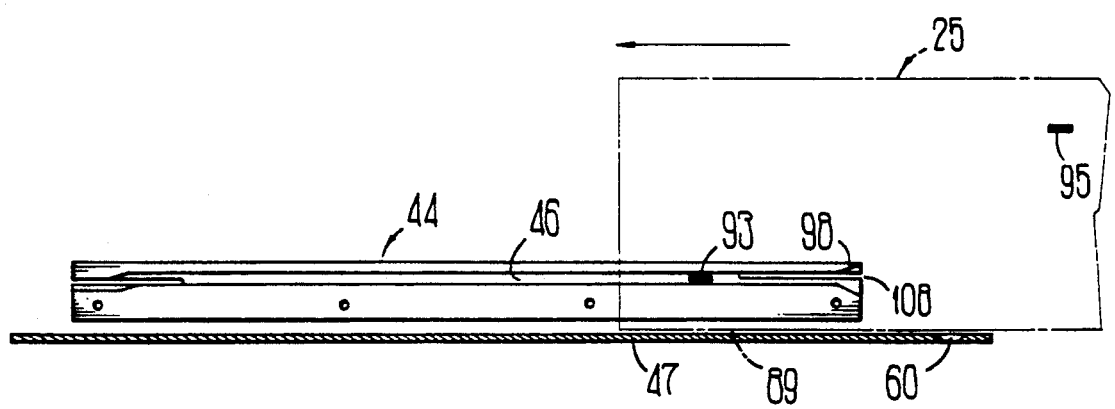
FIGS. 11A-11C are illustrative views illustrating the installation of a power supply into its supporting tray.
Figure 11B:
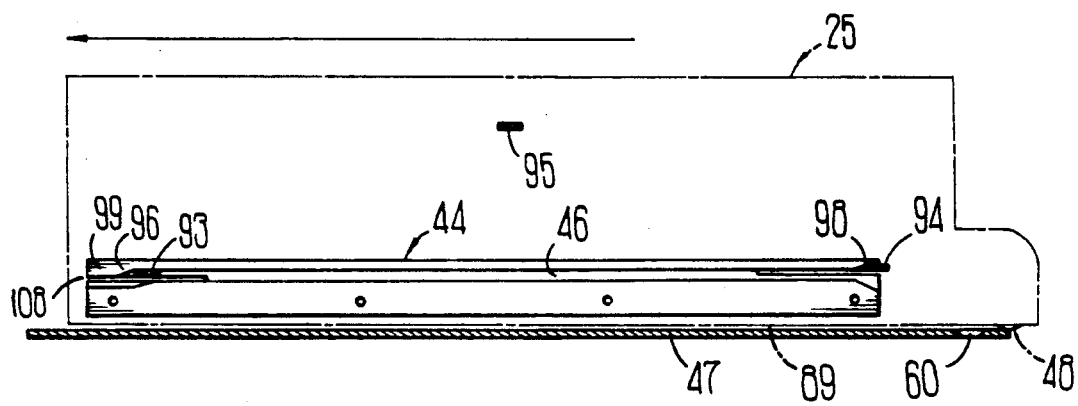
Figure 11C:
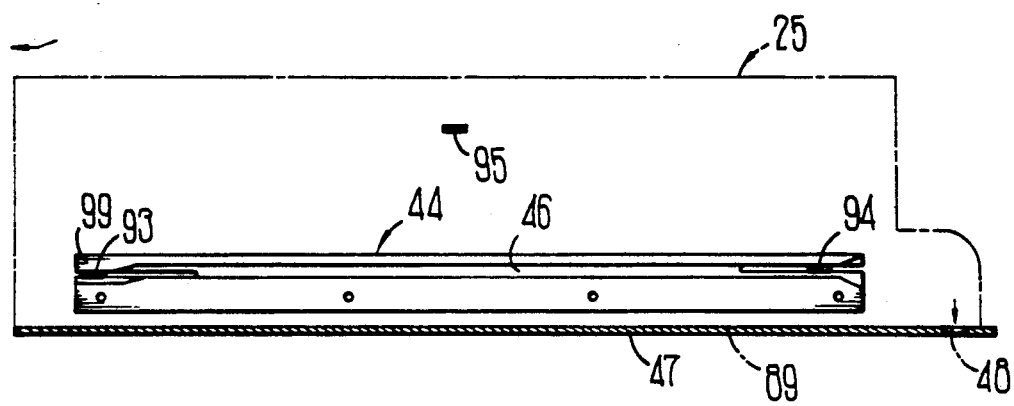
Figure 12:
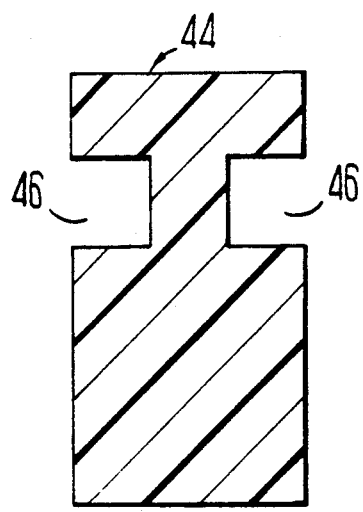
FIG. 12 is a transverse cross sectional view of a slotted guide forming part of the invention.

Referring to FIGS. 11A through 11C, installation of the power supplies 25 into their desired positions is now discussed.

As previously discussed, two sliding tabs are positioned on each side panel of the power supplies, one being a rear tab 93 and the other being a front tab 94. As shown in FIG. 11A, each of the front tabs 94 is positioned a finite distance higher (as the converter is normally positioned), relative to the rear tab 93. As the power supply 25 is slid into position, each of the rear tabs 93 is positioned within a slot 46 of a corresponding slotted guide 44. As shown in FIG. 11B, the power supply is further slid into place until each front tab likewise fits within the slot 46 of a corresponding slotted guide 44. At this time, it may be noted that the lower planar surface of the power supply is closely adjacent to the horizontal tray surface 47, with the front most surface being urged somewhat against the tray surface at 48, at least partially by the urging action of front flange 98.

When the power supply is urged from its position in FIG. 11B to FIG. 11C, it may be seen that the rear tabs 93 are urged downwardly somewhat in order to follow the offset relationship of the slot 46, with the slot taking a downward offset at position 96. When the power supply is in its final position as shown in FIG. 11C, a major portion of the lower surface 89 of the power supply 25 is in biased contact with the horizontal surface 47 of the tray, and a connector positioned at the rear of the power supply (not shown) is in mating contact with a connector 104 (See FIG. 16) attached at the rear of each tray.

From FIG. 11B to FIG. 11C, the urging is provided by a conventional handle assembly such as that known in the art as an "inserter/extractor", operating similar to the units 24 discussed with respect to the enclosed circuit board assemblies 20. The inserter/extractor comprises a handle (See FIG. 16), which grasps two tabs 106, one extending from each interior side wall 45 of each tray, when being urged from its "open" to its "closed" position, thus urging the power supply into its desired position. Removal procedure is opposite to that of insertion, with the handle being urged into an open position to draw the circuit board out of its installed position.

As previously discussed, a portion of the lower surface 89 of the power supply may be in temporary sliding contact with the horizontal surface 47 of the tray. To prevent damage due to frictional sliding contact, a button (not shown) made of nylon or other similar material may be provided on the lower rear surface of the power supply 25 to obviate such damage. In order to maintain optimum contact between the power supply and the horizontal surface 47 of the tray, a corresponding dimple 60, as shown in FIG. 16, may be provided in the horizontal surface 47 at the point where the point where the nylon button will be positioned when the power supply 25 is in its fully installed position.

As shown in FIGS. 11A-C, a pair of open-ended slots 108 are present at each end of each of the slotted guides 44. As best shown in FIG. 11C, these slots provide the guides with free flanges 98, 99, which act as springs in urging the tabs 94, 93, downwardly, due to the relative height positioning of the tabs and the flanges when the power supplies are in place. This is also in important feature of the invention, as this spring action provides needed bias which encourages heat transmission from the lower surface 89 of the power supply with the horizontal surface 47 of the tray 34.

Figure 13:
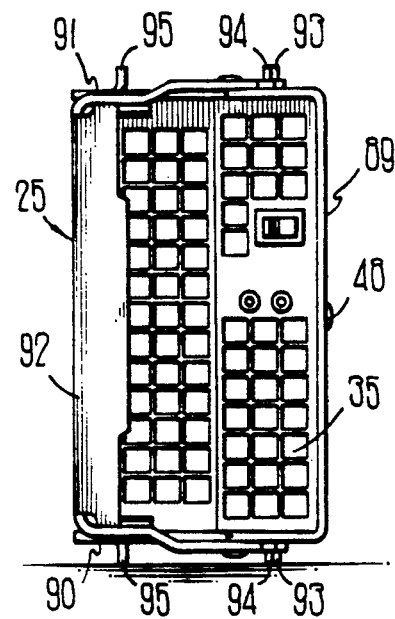
FIG. 13 is an illustrative view of a power supply positioned out of the rack assembly and placed on a supporting surface.

When the power supply member is removed from the apparatus 10, it may be desirable to place it upon an external planar surface for storage (see FIG. 13). Should the power supply be placed on its side as shown in FIG. 13, such that the one of the front tabs and one of the rear tabs come in contact with the external surface, the power supply would be unstable as it would rest on only two tabs. Therefore a third support tab 95 is provided in order that the convertor may rest securely on the three tabs.

Therefore it may be seen that the connection means provided between the power supply provide a readily detachable connection between the frame of the apparatus 10 and the power supplies, but also allows for biased contact between a planar surface of the power supply and a planar surface of a frame member which may act as as a heat sink.

The air flow afforded by the unique configuration of the apparatus 10 is in important feature of the invention.

As previously discussed, the apparatus includes a pair of fans 27 positioned at the upper rear of the apparatus. These fans are intended for continuous operation during the operation of the apparatus 10. Referring to FIG. 2, it may be seen that the fans are positioned at the rear of the upper cavity 14, and draw air from within the upper cavity to the outside atmosphere 49. As discussed above, air is drawn into the apparatus through front access door vent 28. Therefore at least a portion of the air flow passes from the front vent 28 to the upper cavity. The two power supplies are positioned in this flow path and are mounted within corresponding trays 34. It may be seen that unique configuration of the trays allow the power supplies 25 to be cooled by the ventilating action of the air, not only by air passing between the power supples and the corresponding tray, thus cooling the outer cover surfaces of the power supplies, but also by air which passes through front grills 35 and within the cover enclosure of each power supply 25, thus providing additional cooling by direct contact with the electrical components concealed within the enclosures.

Although air is directed through the upper cavity 14 at all times during operation of the apparatus 10, the unique internal configuration of the apparatus 10 allows air to be selectively directed through any enclosed circuit board assembly which is in place in the lower cavity 12, without air flow being wasted by attempting to adequately ventilate the entire lower cavity 12. This unique configuration includes a plurality of pivoting doors 61 (See FIG. 15) which are positioned side-by-side to substantially seal a single elongate gap 64 which extends substantially from one side of the apparatus to the other, and provides a means of substantial air flow from the lower cavity 12 to the upper cavity 14. In the preferred embodiment, the number of doors 61 corresponds to the number of spaces 13 in the lower cavity 12, and thus the amount of enclosed circuit board assemblies 20 which the lower cavity is capable of retaining.

As a particular enclosed circuit board assembly 20 is inserted into a particular space of the lower cavity 12, the upper rear end of the enclosed circuit board 23 within the assembly contacts a cam 110 on the underside of the pivoting door and pivots it up and out of the way, as shown in FIG. 2 and best in FIG. 15, such that the top upper corner of the enclosed circuit board assembly 20 passes through the gap 64, and such that the outlet hole 16 of the enclosed circuit board assembly 20 is positioned within the upper cavity 14. As the operation of the fans, as discussed above, forces air from within the upper cavity 14 to the outside atmosphere of the apparatus 10, thus forming a partial vacuum within the upper cavity 14, air from within the enclosed circuit boards will tend to be drawn out of outlet hole 16 (See FIGS. 2 and 15) of the circuit board assembly. Thus it may be seen air will tend to flow into the enclosed circuit board through one or both of the upper and lower front vent holes 17, 18, and across the internal components of the enclosed circuit board assembly 20, thus cooling them.

It may be understood that air will tend to enter the lower vent hole 18 of each installed enclosed circuit board assembly 20. However air may flow in or out of the upper vent hole of the installed enclosed circuit board assemblies, depending on the position of the assemblies within the lower cavity. Tests have found that air will tend to flow out of the upper front vent holes (up adjacent the access door and into the upper cavity)

for assemblies positioned at the outer edges of the lower cavity, while upper vent holes 17 in assemblies 20 positioned in the middle of the lower cavity 12 will tend to act as inlets. Either of these flow characteristics is advantageous, as ventilation is being provided to components adjacent to the upper front vent 17. With respect to the "cross-over point" at which such flow reverses, testing has determined this to be approximately between the first and third spaces 13 adjacent to each side of the lower cavity. That is, at some point between the first and third space from each side of the lower cavity, adjacent circuit boards may exhibit different flow directions through the upper front vent 17, and, should one space be positioned in line with the cross-over point, resulting in stagnation of flow in the upper front vent of an enclosure positioned in this space 13. However, ventilation has nonetheless been found to be effective, as such positions may be seen to be nearly in line with fans at the rear of the apparatus 10, and thus a higher flow is maintained from the lower front vent 18 to the rear exit vent 16, and such higher flow has been found to creates extra turbulence within the enclosures 20 to provide adequate ventilation. It should be understood that the preferred embodiment of the circuit boards positioned within the enclosed circuit board assemblies is such that the "hottest" components are positioned in a path intermediate the front lower vent 18 and the rear exit vent 16.

It should be understood that not all of the cavities, mating connections, etc., described above are completely airtight. For example, some air may be allowed to pass between the pivoting doors even though no enclosed circuit board have urged them aside, as a gap of approximately 0.050" has been provided to allow adequate clearance between the doors. Furthermore, it may be possible that some air will be able to creep in though various cracks in the frame of the apparatus. However, the flow though such cracks and gaps is small compared to the large passageways through which the air intended to flow as described above.

It should be understood that the foregoing relates only to a preferred embodiment of the present invention, and that numerous modifications or alterations may be made therein without departing from the spirit and scope of the invention as set forth in the appended claims. All U.S. patents recited within this application are incorporated by reference.

What is claimed is:

1. An apparatus, comprising:
   an enclosed circuit board assembly defining an inner cavity and an inlet vent hole and an outlet vent hole; and
   an enclosed circuit board assembly supporting member itself comprising:
   a) a cavity member defining an inlet air vent hole, an outlet air vent hole, and defining an inner air cavity;
   b) hole restriction means movable between an open and a closed position, said hole restriction means restricting air passage through said inlet air vent hole of said cavity member to a greater extent when in said closed position than when in said open position;
   c) air transfer means transferring air out of said outlet air vent hole of said cavity member such that air tends to be drawn through said inlet air vent hole of said cavity member when said hole restriction means is in said open position; and
   d) mounting means mounting said enclosed circuit board assembly in a mounted position relative to said cavity member such that said hole restriction means is selectively urged from said closed position to said open position responsive to said mounting of said enclosed circuit board assembly, and such that said outlet vent hole of said enclosed circuit board assembly is positioned in a communicating relationship relative to said inlet vent hole of said cavity member,
   such that with said enclosed circuit board assembly in said mounted position, said air transfer means causes air to pass along a path through said inlet and then said outlet vent holes of said enclosed circuit board assembly, and through said inlet and then said outlet holes of said cavity member.

2. The apparatus as claimed in claim 1, wherein said hole restriction means is a trap door urged from its closed position to its open position by contact with a portion of said enclosed circuit board assembly.

3. The apparatus as claimed in claim 2, wherein said air transfer means is a fan positioned in said outlet vent hole of said cavity member, said fan configured to blow air out of said inner cavity of said cavity member through said outlet air vent hole of said cavity member.

4. The apparatus as claimed in claim 1, wherein said air transfer means is a fan positioned in said outlet vent hole of said cavity member, said fan configured to blow air out of said inner cavity of said cavity member through said outlet air vent hole of said cavity member.

5. An apparatus, comprising:
   a first enclosed circuit board assembly defining an inner cavity and an inlet vent hole and an outlet vent hole;
   a second enclosed circuit board assembly defining an inner cavity and an inlet vent hole and an outlet vent hole; and
   an enclosed circuit board assembly supporting member itself comprising:
   a) a cavity member defining an inner air cavity, first and second inlet air vent holes, and an outlet air vent hole;
   b) first hole restriction means movable between an open and a closed position, said first hole restriction means restricting air passage through said first inlet air vent hole of said cavity member to a greater extent when in said closed position than when in said open position;
   c) second hole restriction means independent in operation relative to said first hole restriction means, said second hole restriction means movable between an open and a closed position, said second hole restriction means restricting air passage through said second inlet air vent hole of said cavity member to a greater extent when in said closed position than when in said open position;
   d) air transfer means transferring air out of said outlet air vent hole of said cavity member such that air tends to be drawn through said first inlet air vent hole of said cavity member when said first hole restriction means is in said open position and through said second inlet air vent hole of said cavity member when said second hole restriction means is in said open position;
   e) first mounting means mounting said first enclosed circuit board assembly in a mounted position relative to said cavity member such that said first hole restriction means is selectively urged from said closed position to said open position responsive to said mounting of said first enclosed circuit board assembly, and such that said outlet vent hole of said first enclosed circuit board assembly is positioned in a communicating relationship relative to said first inlet vent hole of said cavity member; and f) second mounting means mounting said second enclosed circuit board assembly in a mounted position relative to said cavity member such that said second hole restriction means is selectively urged from said closed position to said open position responsive to said mounting of said second enclosed circuit board assembly, and such that said outlet vent hole of said second enclosed circuit board assembly is positioned in a communicating relationship relative to said second inlet vent hole of said cavity member, such that with said first enclosed circuit board assembly in said mounted position, said air transfer means causes air to pass along a path through said inlet and then said outlet vent holes of said first enclosed circuit board assembly, and through said inlet and then said outlet holes of said cavity member, and such that with said second enclosed circuit board assembly in said mounted position, said air transfer means causes air to pass along a path through said inlet and then said outlet vent holes of said second enclosed circuit board assembly, and through said inlet and then said outlet holes of said cavity member.

6. The apparatus as claimed in claim 5, wherein said first and second hole restriction means are first and second trap doors urged from their closed position to their open positions by contact with corresponding said first and second enclosed circuit board assemblies.

7. The apparatus as claimed in claim 6, wherein said air transfer means is a fan positioned in said outlet vent hole of said cavity member, said fan configured to blow air out of said inner cavity of said cavity member through said outlet air vent hole of said cavity member.

8. The apparatus as claimed in claim 5, wherein said air transfer means is a fan positioned in said outlet vent hole of said cavity member, said fan configured to blow air out of said inner cavity of said cavity member through said outlet air vent hole of said cavity member.

* * * * *